(12) United States Patent
Chakraborty

(10) Patent No.: US 9,647,669 B1
(45) Date of Patent: May 9, 2017

(54) HIGH SPEED FREQUENCY DIVIDER

(71) Applicant: Texas Instruments Incorporated, Dallas, TX (US)

(72) Inventor: Sudipto Chakraborty, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/212,411

(22) Filed: Jul. 18, 2016

(51) Int. Cl.
H03K 23/54 (2006.01)
H03K 23/44 (2006.01)

(52) U.S. Cl.
CPC .................................. H03K 23/44 (2013.01)

(58) Field of Classification Search
CPC ..... H03K 23/54; H03K 23/542; H03K 23/548
See application file for complete search history.

(56) References Cited

U.S. PATENT DOCUMENTS

| | | | | |
|---|---|---|---|---|
| 6,163,182 A | * | 12/2000 | Canard | H03K 23/542 327/115 |
| 6,847,239 B2 | * | 1/2005 | Leifso | H03K 23/544 327/113 |
| 7,289,592 B2 | | 10/2007 | Lee | |
| 8,299,827 B2 | | 10/2012 | Subburaj et al. | |
| 9,257,991 B2 | | 2/2016 | Pace | |
| 2004/0017233 A1 | | 1/2004 | Wood | |
| 2005/0058236 A1 | | 3/2005 | Ke | |
| 2007/0146021 A1 | | 6/2007 | Stikvoort et al. | |
| 2008/0042699 A1 | | 2/2008 | Narathong et al. | |
| 2008/0043893 A1 | | 2/2008 | Nagaraj et al. | |
| 2008/0258781 A1 | * | 10/2008 | Song | H03K 23/425 327/117 |
| 2010/0046693 A1 | | 2/2010 | Ellersick | |
| 2010/0102877 A1 | | 4/2010 | Welland et al. | |
| 2015/0207510 A1 | | 7/2015 | Pace | |

OTHER PUBLICATIONS

RF430CL33H "Dynamic NFC Interface Transponder", Texas Instruments, SLAS916C—Nov. 2012—Revised Nov. 2014, 49 pgs.

* cited by examiner

*Primary Examiner* — Jeffrey Zweizig
(74) *Attorney, Agent, or Firm* — John R. Pessetto; Charles A. Brill; Frank D. Cimino

(57) ABSTRACT

Disclosed examples include frequency divider circuits, comprising an even number 4 or more differential delay circuits coupled in a cascade ring configuration of a configurable length N, with N–K of the N delay circuits providing an inverted polarity output signal to a succeeding delay circuit in the cascade ring configuration to control an amount of overlap between phase shifted clock signals from the delay circuits.

20 Claims, 5 Drawing Sheets

HIGH SPEED FREQUENCY DIVIDER

BACKGROUND

Many communications and processing devices include circuitry that operates according to clock input signals. Typically, a high frequency master clock signal (CML or CMOS type) is provided by a voltage-controlled oscillator (VCO) or other clock source, and one or more frequency dividers are used to divide the VCO output signal to generate lower frequency clock signals for use by the individual circuits. New applications in the wired and wireless communication space demand higher clock speeds and duty cycle reconfigurability. In addition, many applications require low power clock circuits that can provide a wide variety of overlapping and non-overlapping clock signals, and which are scalable with respect to duty cycle.

SUMMARY

Disclosed examples include frequency divider circuits price of cascade ring configurations of differential delay circuits of a configurable length N in which an integer number K of the N delay circuits provides a direct connection of its output signal to a succeeding delay circuit and N–K delay circuits provide an inverted polarity output signal to a succeeding delay circuit the in the cascade ring configuration to control an amount of overlap between phase shifted clock signals from the delay circuits. Certain examples, moreover, provide programmable links to set the frequency divider ratio and duty cycle. The frequency divider circuit examples can be made programmable by external configuration signals in certain examples, allowing adaptation for a variety of different end-use applications. In addition, certain embodiments concurrently provide overlapping and non-overlapping phase shifted clock output signals to accommodate transceivers and other applications requiring overlapping as well as non-overlapping clock signals.

DETAILED DESCRIPTION

Figure 1:
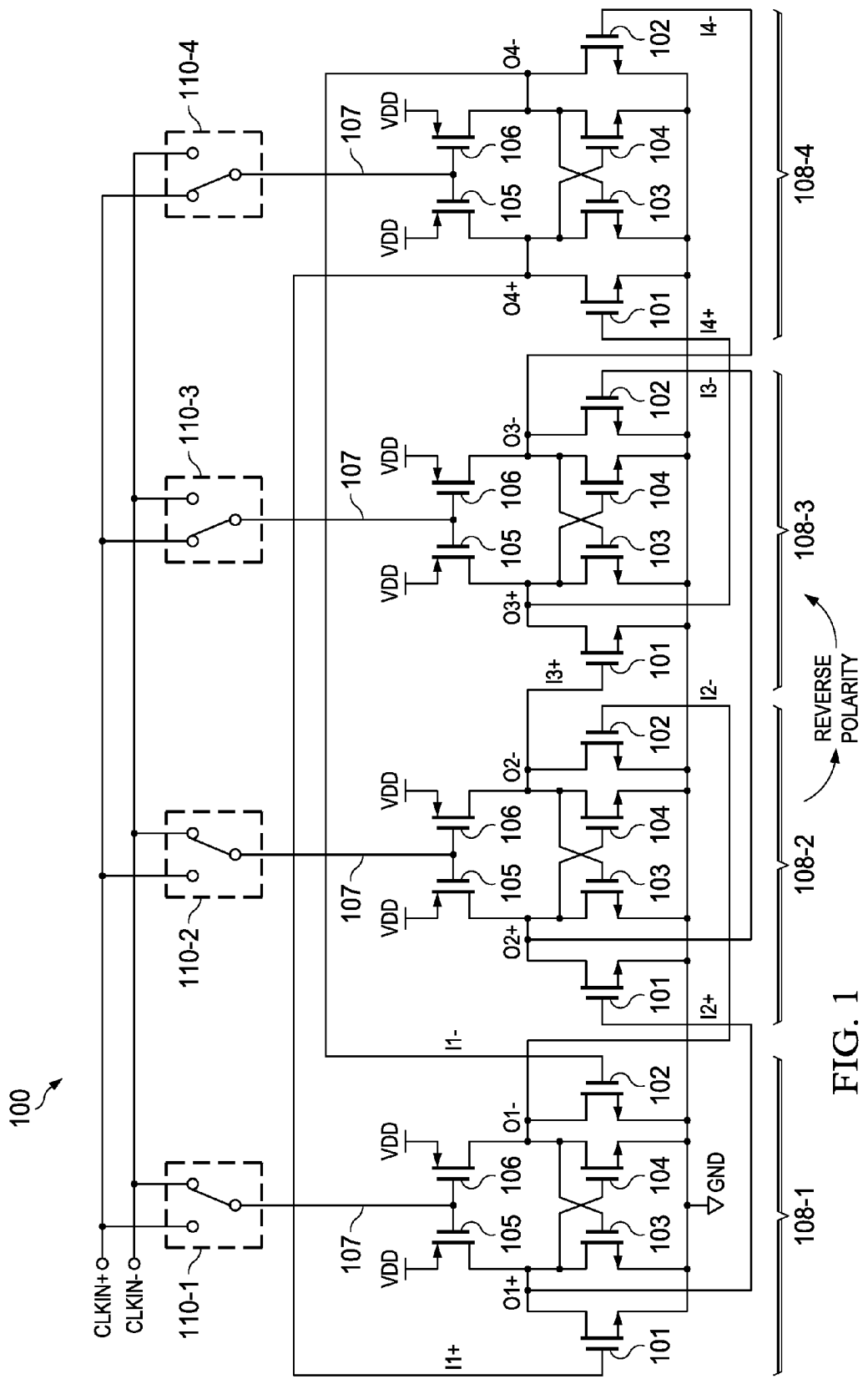
FIG. 1 is a schematic diagram of a four-stage frequency divider circuit with four differential delay circuits coupled in a cascade ring configuration with the polarity of the output of a middle delay circuit reversed.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Figure 2:
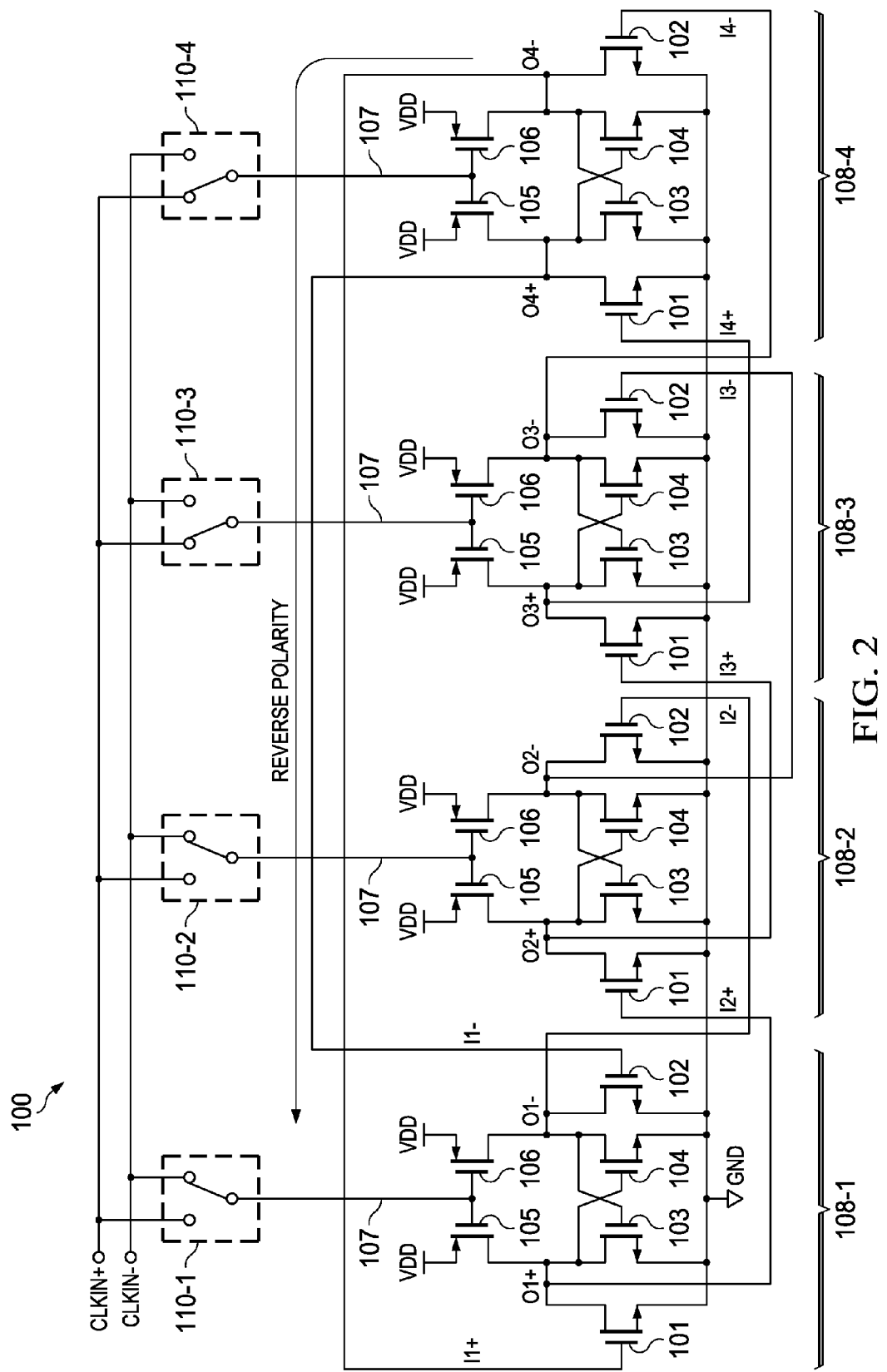
FIG. 2 is a schematic diagram of the four-stage frequency divider circuit with the differential output signal polarity of the final delay circuit reversed.

FIG. 1 shows a four-stage frequency divider circuit 100 with four differential delay circuits or stages 108-1, 108-2, 108-3 and 108-4 coupled in a cascade ring configuration with the polarity of the output of the middle delay circuit 108-2 reversed. FIG. 2 shows the four-stage frequency divider circuit 100 reconfigured with the differential output signal polarity of the final delay circuit reversed. As detailed further in connection with FIG. 5, the present disclosure generally provides frequency divider circuits 100 with an even number 4 or more differential delay circuits 108 coupled in a cascade ring configuration of a configurable length N to set the divider ratio of the circuit 100, where N is an even number greater than or equal to 4. In this regard, the disclosed examples provide output clock signals at a frequency equal to frequency of an input clock signal CLKIN divided by the length N of the ring circuit configuration. In addition, the ring circuit configuration length N sets the duty ratio of the resulting clock output signals. As seen in the examples of FIGS. 1 and 2, one of the N delay circuits 108 provides an inverted polarity output signal to a succeeding delay circuit 108 in the cascade ring configuration. In other examples, an integer number "K" of the N stages 108 provide a direct connection to the succeeding delay circuit 108, and the remaining N–K delay circuits 108 provide an inverted polarity output signal to the succeeding delay circuit 108 in the cascade ring configuration, where 1≤K<N.

The following table shows an example 4-stage configuration along with several different clock interconnections to either CLKIN+ or CLKIN– based on the configuration of the corresponding stage clock input signal switch 110, as well as the corresponding stage output duty cycle (%):

| 108-1 | 108-2 | 108-3 | 108-4 | O1 | O2 | O3 | O4 |
|---|---|---|---|---|---|---|---|
| CLKIN– | CLKIN– | CLKIN+ | CLKIN+ | 25% | 50% | 25% | 50% |
| CLKIN+ | CLKIN– | CLKIN– | CLKIN– | 25% | 25% | 50% | 50% |
| CLKIN+ | CLKIN+ | CLKIN– | CLKIN– | 25% | 50% | 25% | 50% |
| CLKIN+ | CLKIN+ | CLKIN+ | CLKIN– | 25% | 50% | 50% | 25% |

As seen above, and certain examples, the position of the 25% or 50% duty cycle outputs is determined by the specific phase of clock insertion points in the ring according to the configuration of the switches 110. A "balanced" combination would be M stages taking one phase of the clock "CLKIN+" and the other M stages taking "CLKIN−", so that two of the outputs would be 25% duty cycle and two of them would have a 50% duty cycle. However, different examples can also operate in an unbalanced condition. In this regard, the input clock has a 50% duty cycle and CML type in nature. Certain disclosed examples can thus provide: (a) CML to CMOS conversion, (b) frequency division, (c) Duty cycle modification (e.g., in a self aligned manner, without requiring combinatorial logic), and (d) simultaneous 50% and 25% duty cycle outputs.

In certain examples, the inverted or reversed polarity location(s) in the cascade ring configurations is/are configurable to control overlap between phase shifted clock signals from the delay circuits 108. In certain examples, moreover the frequency divider circuit 100 provides both overlapping phase shift clock signals as well as non-overlapping clock output signals simultaneously. In this manner, the disclosed circuits 100 are particularly advantageous in transceivers or other applications where configurable clock signal overlap and duty cycle are desired. The disclosed circuits are also capable of providing different duty cycle outputs simultaneously from a single chain of divider, which is quite suitable for interfacing with a wireless transceiver circuits.

The frequency divider circuit 100 includes coupling circuit to interconnect or couple some or all of the delay circuits 108 output-to-input in a circular ring configuration, with the differential output of the final or Nth circuit 108 coupled with the differential input of a predefined first circuit 108-1. In certain examples, the coupling circuit is configurable to select the Nth circuit 108 from a total of M delay circuits 108-1 through 108-M, where M is an even integer greater than or equal to the configured ring length N. In the examples of FIGS. 1 and 2, N=M=4. In other examples, the circuit 100 includes M>N delay circuits 108, and the coupling circuit receives one or more length select input signals and interconnects N of the delay circuits to form a cascade ring circuit configuration of length N.

As seen in FIGS. 1 and 2, the individual delay circuits 108 include a clock input 107 to receive a direct polarity signal (CLKIN+) or a reverse polarity signal (CLKIN−) based on the input clock signal CLKIN having a first frequency the a corresponding configurable clock input switch circuit 110-1, 110-2, 110-3 and 110-4. The individual delay circuits also include first and second (e.g., plus or "+" and minus or "−") delay inputs I+ and I− to receive a differential input signal from a preceding circuit 108 in the ring configuration, as well as first and second delay outputs O+ and O− to provide a differential output signal. In FIGS. 1 and 2, the delay circuit 108-1 is predefined as the first delay stage, and includes delay inputs I1+ and I1− receiving a differential input signal from the fourth (i.e., Nth) stage 108-4 along with differential outputs O1+ and O1−. An integer number K=3 of the intra-stage couplings in FIGS. 1 and 2 provide no polarity reversal, and a single (e.g., N−K=1) interconnection (between circuits 108-2 and 108-3 in FIG. 1, between the circuits 108-4 and 108-1 in FIG. 2) provides signal polarity reversal. Moreover, the location of the polarity reversal coupling(s) can be configured in certain examples (e.g., FIG. 5 below) to allow reversal of the differential output of the middle stage or reversal of the Nth differential output to provide configurability of output signal overlap in one example.

The individual delay circuits 108 in FIGS. 1 and 2 include a plurality of transistors 101-106 forming a latch circuit that updates the corresponding differential output signal according to the differential input signal in each cycle of the input clock signal CLKIN. In one example, the individual circuits 108 include six MOS transistors, including outer NMOS input transistors 101 and 102 having gate control terminals forming the first and second delay inputs I+ and I− to respectively receive the differential output from the preceding circuit 108 in the ring configuration. The sources of the transistors 101 and 102 are coupled with a constant reference voltage node, such as a circuit ground connection GND in one example. The latch circuitry of the individual delay circuits 108 further includes cross-coupled NMOS transistors 103 and 104 and upper PMOS transistors 105 and 106. The gates of the PMOS transistors 105 and 106 are coupled to one another at the clock input 107 to receive the CLKIN signal. The sources of the PMOS transistors 105 and 106 are coupled with a supply voltage node VDD. The drains of the transistors 101, 103 and 105 are coupled together to form the first or "+" delay output O+, which is cross-coupled with the gate of the transistor 104. Similarly, with the drains of the transistors 102, 104 and 106 are coupled together to form the second or "−" delay output O−, which is also cross-coupled with the gate of the transistor 103. This structure forms a differential latch circuit 101-106 that receives a differential input signal from a preceding delay circuit 108 and updates the differential output signal provided to a succeeding delay circuit 108 in the cascade ring configuration according to the differential input signal in each cycle of the input clock signal CLKIN provides a differential output signal.

The ring configuration examples of FIGS. 1 and 2 implement a divide-by-4 frequency divider 100 (N=4) in which the clock outputs O1+, O1−, O2+, O2−, O3+, O3−, O4+ and O4− can individually be used to provide a clock output signal at a frequency one fourth of the input frequency of the CLKIN signal. In certain examples, output buffer circuits are provided to generate buffered output clock signals CO based on the single-ended clock outputs O+ and O−, as shown further below in FIGS. 5 and 7.

As previously mentioned, the output-to-input coupling between the delay circuits 108 is set to provide non-inverted or non-reversed coupling for K intra-stage coupling, and N−K intra-stage coupling(s) provide polarity inversion or reversal. In FIG. 1, the output O1+ is coupled to the second stage input I2+ and the output O1− is coupled to the input I2− for non-reversed polarity. The second stage output O2+, however, is coupled to the negative input I3− of the third stage delay circuit 108-3, and the output O2− is reverse coupled to the input I3+. The third stage output O3+ is coupled to the input I4+ and the output O3− is coupled to the input I4− for non-reversed polarity, and the fourth stage outputs O4+ and O4− are respectively coupled to the first stage inputs I1+ and I1− for non-reversed polarity.

In FIG. 2, the coupling circuitry instead provides non-reversed polarity connections for the outputs of the delay circuits 108-1, 108-2 and 108-3, and reverse polarity coupling for the output of the final (Nth) stage 108-4. In this example, the second stage output O2+ is coupled to the third stage input I3+ and the output O2− is coupled to the input I3− for non-reversed polarity. However, the final stage output O4+ is coupled to the first stage input I1− and the output O4− is coupled to the input I1+ for reversed polarity.

Figure 3:
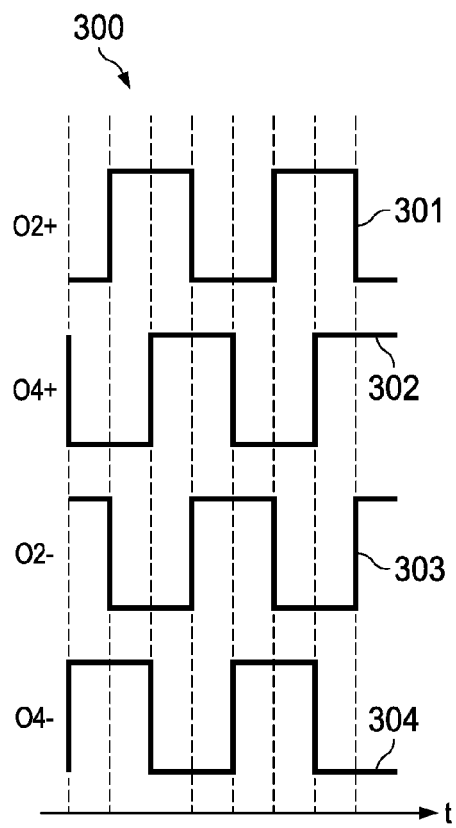
FIG. 3 is a waveform diagram showing quadrature phase shifted overlapping clock output signals from the even-numbered delay circuits in the frequency divider of FIG. 2.
Figure 4:
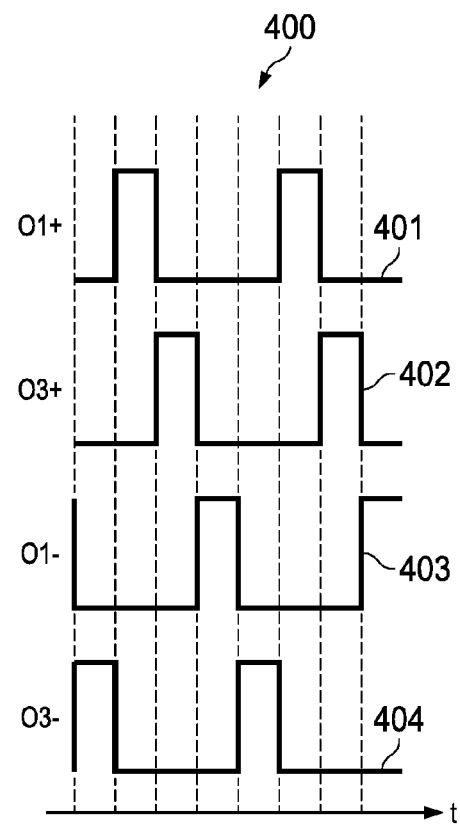
FIG. 4 is a waveform diagram showing quadrature phase shifted non-overlapping clock output signals from the odd-numbered delay circuits in the frequency divider of FIG. 2.

Referring also to FIGS. 3 and 4, a waveform diagram 300 in FIG. 3 shows quadrature phase shifted overlapping clock output signals 301-304 from the even-numbered delay circuits 108-2 and 108-4 in the frequency divider circuit 100 of FIG. 2. As seen in FIG. 3, the configuration of the divider circuit 100 in FIG. 2 provides 50% duty cycle clock output signal waveforms 301 at the output O2+, a 90 degree phase shifted 50% duty cycle waveform 302 at the output O4+, as well as a further 90 degree shifted waveform 303 at the output O2− and a further 90 degree phase shifted output signal waveform 304 at the output O4−. The phase shifted clock output signals 301-304 in FIG. 3, moreover, have non-zero overlap.

In contrast, FIG. 4 shows a diagram 400 with non-overlapping quadrature phase shifted clock output signals 401-404 from the odd-numbered delay circuits 108-1 and 108-3 in the frequency divider 100 of FIG. 2. In this case, the outputs O1+, O3+, O1− and O3− provide successively phase shifted, non-overlapping clock output signal waveforms 401, 402, 403 and 404, respectively. In addition, the duty cycle of the clock output signal waveforms 401-404 at the odd-numbered delay circuit outputs are 25%.

Figure 5:
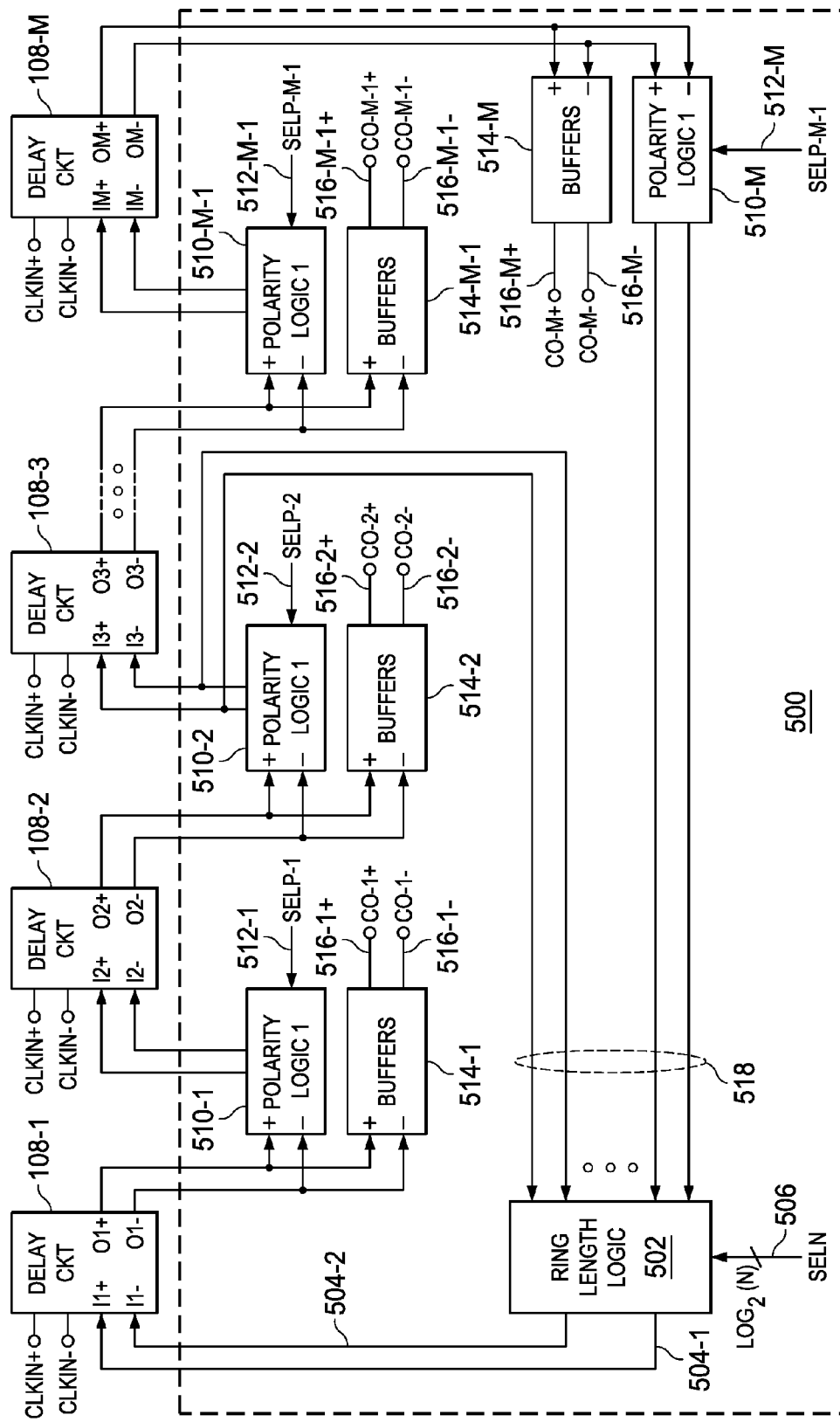
FIG. 5 is a schematic diagram of an M-stage frequency divider circuit with M differential delay circuits coupled in a configurable cascade ring configuration with configurable polarity logic circuits and output buffer circuits.

FIG. 5 shows a further example frequency divider circuit 100 in which the cascade ring circuit length N is configurable via coupling circuitry. Further, the coupling circuit in FIG. 5 provides for configurable location of the reverse-polarity intra-delay circuit coupling. In this example, the circuit 100 includes M delay circuits 108, which can be individually constructed in one example using transistors 101-106 as described above (e.g., FIGS. 1 and 2), where M is an even integer greater than or equal to 4. The frequency divider circuit 100 and FIG. 3 is configurable by way of programmable ring length logic circuitry 502 and polarity logic circuitry 510 providing a configurable coupling circuit for interconnecting an integer number M delay circuits 108-1, 108-2, . . . 108-M. In particular, the ring length logic circuit 502 allows configuration of an integer number N of the M delay circuits 108 to form a cascade ring configuration, where N is a positive even integer less than or equal to M. In addition, the circuit 100 includes an integer number M polarity logic circuits 510-1, 510-2, . . . 510-M individually coupled with a corresponding one of the delay circuits 108 in order to selectively provide non-reversed or reversed polarity of the interconnection to a subsequent delay circuit 108 in the cascade ring configuration.

The ring length logic circuit 502 receives the differential outputs of even numbered ones of the polarity logic circuits 510-2 through 510-M as inputs 518. The logic circuit 502 operates according to a length select input signal SELN to couple the differential output of a selected Nth one of the delay circuits 108 to the predefined first delay circuit 108-1. In one example, the length select input signal is a single or multi-bit digital signal received at an input 506 of the ring length logic circuit 502. For example, where M=16, a 4-bit signal SELN is received at the input 506 in order to set the ring configuration length N of the configured circuit 100. In addition, the polarity logic circuitry 510 operates according to polarity select input signals SELP-1, SELP-2, . . . SELP-M to selectively couple the differential delay output signals of all (or at least N) of the delay circuits 108 to the respective succeeding delay circuits 108 in the cascade ring configuration. In certain examples, the polarity logic circuitry 510 is configured by the SELP signals to couple the differential output signal of a given one of the N delay circuits 108 to its succeeding delay circuit 108 with a reverse polarity, and to couple the differential output signals of the remaining N−1 delay circuits 108 in the cascade ring configuration to their respective succeeding delay circuits 108 with no polarity reversal. For example, the circuit configuration of FIG. 2 above can be implemented in the example 100 of FIG. 5 by applying the SELN signal to cause the ring length logic circuit 502 to couple the output of a fourth polarity logic circuit 510-4 to the differential inputs I1+, I1− of the predefined first latch ring stage/delay circuit 108-1 (thereby setting the cascade ring length to 4), by applying the SELP-4 signal to cause the fourth differential output to be delivered to the ring length logic circuit 502 with reverse polarity, and by applying the signals SELP-1, SELP-2 and SELP-3 to cause the associated polarity logic circuits 510-1, 510-2 and 510-3 to deliver their respective differential delay output signals to the succeeding stage with no polarity reversal.

The circuit of FIG. 5 can be easily reconfigured to instead implement the example of FIG. 1 by changing the SELP-2 and SELP-4 signals. Other configurations of different lengths and polarity reversal locations are thus facilitated by simple changes to the SELN and/or SELP signals applied to the logic circuits 502 and 510. In certain examples, the frequency divider circuit 100 can be implemented as an integrated circuit (IC), including terminals or pads providing external connection to receive the input clock signal CLKIN from an external source, and also to receive the configuration signals SELN and/or SELP from an external source. Such implementations facilitate easy configuration for a given host circuit board application requiring a particular frequency divider ratio N (set by SELN), as well as a configurable location for the polarity reversal within a configured cascade ring arrangement of the delay circuits 108.

Figure 6:
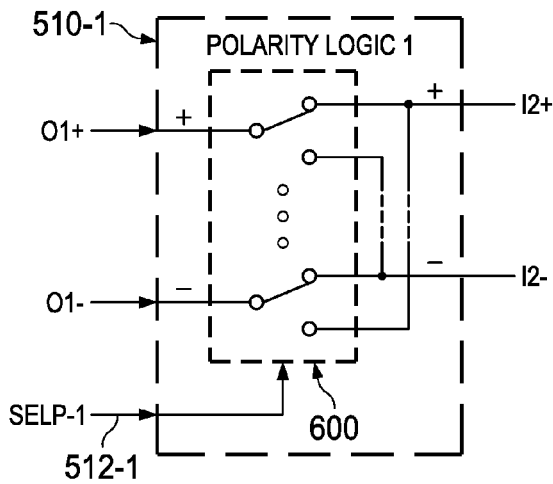
FIG. 6 is a schematic diagram of an example polarity logic circuit in the frequency divider of FIG. 5.

Referring now to FIGS. 5 and 6, the frequency divider 100 in FIG. 5 includes a polarity logic circuit 510 associated with each of the M delay circuits 108. FIG. 6 shows an example implementation of the first polarity logic circuit 510-1 in the frequency divider circuit 100 of FIG. 5, and the other polarity logic circuits 510 can be similarly constructed. The polarity logic circuit 510-1 in FIG. 6 includes first and second polarity logic inputs respectively coupled with the first and second delay outputs O1+, O1− of the delay circuit 108-1 to receive the corresponding differential output signal, as well as first and second polarity logic outputs respectively coupled with the first and second delay inputs I2+, I2− of the succeeding delay circuit 108-2 in the cascade ring configuration of FIG. 5. The polarity logic circuit 510-1 further includes a polarity select input 506 to receive the corresponding polarity select input signal SELP-1. The circuit 510-1 also includes a switching circuit 600 that selectively provides direct or reversed coupling according to the binary state of the input signal SELP-1. When the polarity select input signal SELP is in a first state, the switching circuit 600 couples the first polarity logic input O1+ with the first polarity logic output I2+ and couples the second polarity logic input O1− with the second polarity logic output I2− to couple the differential output signal of the delay circuit 108-1 with the succeeding delay circuit 108-2 with no polarity reversal. When the polarity select input signal SELP is in a different second state, the switching circuit 600 couples O1+ with I2− and couples O1− with I2+ to couple the differential output signal of the delay circuit 108-1 with the succeeding delay circuit 108-2 with the reverse polarity.

Figure 7:
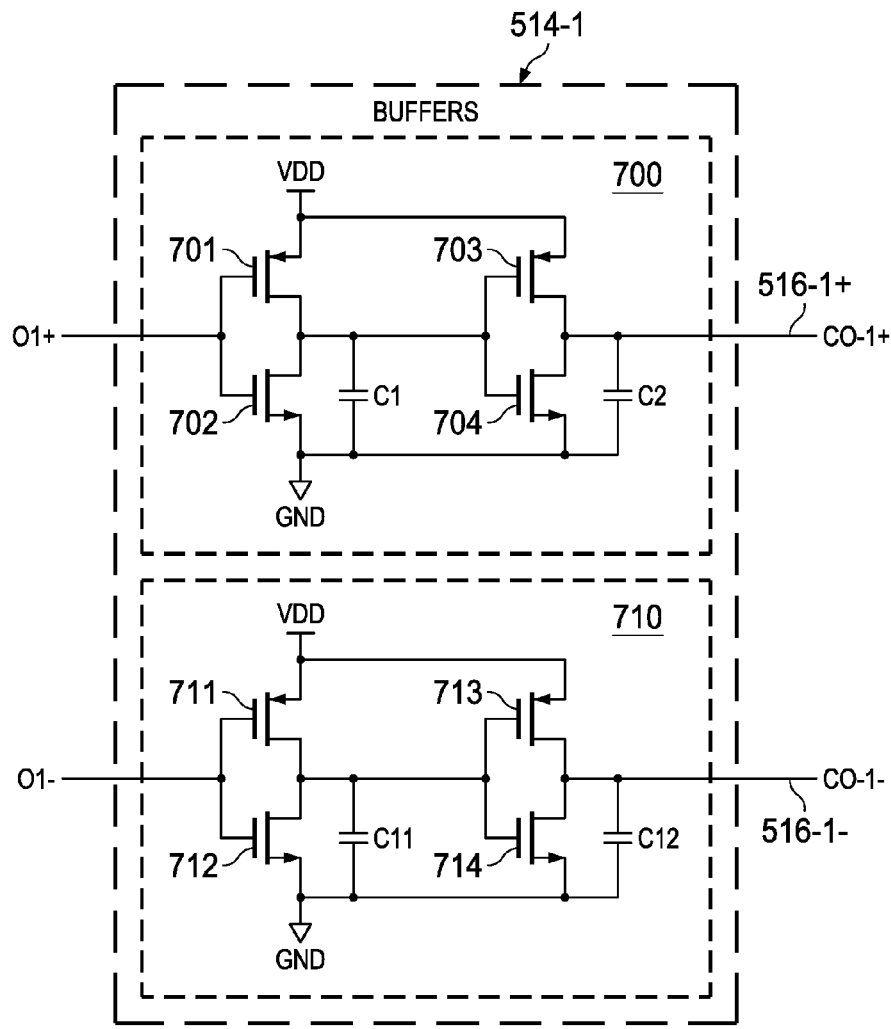
FIG. 7 is a schematic diagram of an example output buffer circuits in the frequency divider circuit of FIG. 5.

FIG. 7 shows an example dual output buffer circuit 514-1 in the frequency divider circuit 100 of FIG. 5. Single buffer circuits 514 can be used, each associated with one of the differential delay outputs of the corresponding delay circuit 108. In the dual buffer example 514-1 of FIG. 7, a first buffer circuit 700 includes a PMOS transistor 701 and an NMOS transistor 702 forming a first CMOS inverter that receives the delay output signal O1+ at the gates of the transistor 701 and 702, and provides a first inverter output at the drains of the transistors 701 and 702. A first capacitor C1 is connected between the first inverter output and the GND node. The buffer circuit 700 further includes a second CMOS inverter formed by a PMOS transistor 703 and an NMOS transistor 704 which inverts the output signal from the first inverter to provide a clock output signal CO-1+ across a second capacitor C2 at a first buffer circuit output 516-1+. A second buffer output circuit 710 similarly provides a first inverter formed by transistors 711 and 712 with a first capacitor C11, as well as a second inverter formed by transistors 713 at 714 and a final output capacitor C12 to provide the second corresponding clock output signal CO-1− at an output 516-1−. In FIG. 5, similar dual buffer circuits 514-2, . . . 514-M−1 and 514-M are individually associated with the M delay circuits 108-1 through 108-M, each having outputs 516-2+, 516-2−, . . . 516-M−1+, 516-M−1−, and 516-M+, 516-M− providing the corresponding clock output signals CO-2+, 516-2−, . . . CO-M−1+, CO-M−1−, and CO-M+, CO-M−. In certain examples, where the divider circuit 100 is included in an integrated circuit, individual output terminals or pads are provided to allow external connection with the individual buffer circuit outputs 516 to deliver the clock output signal CO for use by a host circuit (not shown).

The disclosed examples provide low power, high speed dividers 100 that can provide a wide variety of clock schemes (overlapping and non-overlapping and simultaneous overlapping and non-overlapping outputs), and are scalable in terms of duty cycle and divider ratio N using a configurable ring configuration of differential delay cells 108 to provide a division ratio of N to the input clock frequency. The lowest duty cycle obtained in certain examples is equal to N−2/(2*N). In one example, for N=2P delay cells 108, the output frequency is the input frequency divided by N, with the lowest duty cycle of (2P−2)/(2*2P)=(P−1)/2P, and the disclosed examples facilitate configuration of the duty cycle while keeping the frequency division ratio the same. For example, if the input clock frequency is 2 GHz, the output frequency is 1 GHz for M=2 (or 4 delay cells), and the duty cycle can be 25% or 50% and under some clock phase configurations, both types of duty cycle waveforms can be present at the output with a frequency of the input frequency divided by M. Each of the delay cells 108 in certain examples uses dynamic logic circuits, and utilizes ultra-low power. The divider 100 can also operate with CML level signals in certain implementations. Certain examples can be implemented using fully CMOS circuits, and the disclosed concepts are scalable across technology platforms. Depending on the tapping point and the feedback point, the following example configurations can be obtained Divide-by-2 and 25% duty cycle, Divide-by-4 and 37.5% duty cycle, Divide-by-6 and 41.67% duty cycle. The disclosed examples thus facilitate a wide variation of duty-cycle at the output. Further duty cycle adjustments maybe performed by using combinatorial logic, such as AND/OR function for various outputs. AND functions can be used to reduce or shrink the clock output duty cycle and OR functions can be used to expand to lengthen the duty cycle. In addition, certain configurations, such as in FIG. 2 above, provide simultaneous 50% and 25% duty-cycle outputs especially helpful for RX and TX respectively in a wireless system. The disclosed examples thus provide flexibility with respect to divider ratio and duty-cycle.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A frequency divider circuit, comprising:
an integer number M delay circuits, M being a positive even integer number greater than or equal to 4, the individual delay circuits including:
a clock input to receive an input clock signal having a first frequency,
first and second delay inputs to receive a differential input signal,
first and second delay outputs to provide a differential output signal, and
a latch circuit including a plurality of transistors to update the differential output signal according to the differential input signal in each cycle of the input clock signal; and
a coupling circuit to couple an integer number N of the delay circuits in a cascade ring configuration with individual ones of the M delay circuits coupled to receive a differential input signal from a preceding delay circuit and to provide a differential output signal to a succeeding delay circuit in the cascade ring configuration to implement a divide-by-N frequency divider, N being a positive even integer number less than or equal to M, the coupling circuit operative to couple the differential output signal of an integer number N−K of the N delay circuits to its succeeding delay circuit with a reverse polarity, and to couple the differential output signals of the remaining K delay circuits in the cascade ring configuration to their respective succeeding delay circuits with no polarity reversal, where 1≤K<N.

2. The frequency divider circuit of claim 1, wherein the coupling circuit includes a ring length logic circuit operative according to a length select input signal to couple the differential output of a selected Nth one of the M delay circuits to a predefined first delay circuit to set a divider ratio of the frequency divider circuit according to the configured length N of the cascade ring configuration.

3. The frequency divider circuit of claim 2, wherein the coupling circuit includes M polarity logic circuits individually corresponding to one of the M delay circuits, the individual polarity logic circuits including:
first and second polarity logic inputs respectively coupled with the first and second delay outputs of the corresponding delay circuit to receive the differential output signal from the corresponding delay circuit,
first and second polarity logic outputs respectively coupled with the first and second delay inputs of the succeeding delay circuit in the cascade ring configuration,
a polarity select input to receive a polarity select input signal, and
a switching circuit operative when the polarity select input signal is in a first state to couple the first polarity logic input with the first polarity logic output and to couple the second polarity logic input with the second polarity logic output to couple the differential output signal of the corresponding delay circuit with the succeeding delay circuit with no polarity reversal, the switching circuit operative when the polarity select input signal is in a different second state to couple the first polarity logic input with the second polarity logic output and to couple the second polarity logic input with the first polarity logic output to couple the differential output signal of the corresponding delay circuit with the succeeding delay circuit with the reverse polarity.

4. The frequency divider circuit of claim 3, wherein the coupling circuit is operative to provide N overlapping phase shifted clock signals at the delay outputs of even numbered ones of the N delay circuits when the polarity select input signal corresponding to the Nth delay circuit of the N delay circuits is in the second state and the remaining polarity select input signals corresponding to the remaining N−1 delay circuits in the cascade ring configuration are in the first state.

5. The frequency divider circuit of claim 4, wherein the coupling circuit is operative to provide N non-overlapping phase shifted clock signals at the delay outputs of odd numbered ones of the N delay circuits when the polarity select input signal corresponding to an (N−K)th delay circuit is in the second state and the remaining polarity select input signals corresponding to the remaining K delay circuits in the cascade ring configuration are in the first state.

6. The frequency divider circuit of claim 5, wherein the coupling circuit includes M output buffer circuits individually corresponding to one of the M delay circuits, the individual output buffer circuits including:
first and second buffer inputs respectively coupled with the first and second delay outputs of the corresponding delay circuit to receive the differential output signal from the corresponding delay circuit, and
a buffer output to provide a buffered clock output signal according to the differential output signal from the corresponding delay circuit.

7. The frequency divider circuit of claim 3, wherein the coupling circuit is operative to provide N non-overlapping phase shifted clock signals at the delay outputs of odd numbered ones of the N delay circuits when the polarity select input signal corresponding to an (N−K)th delay circuit is in the second state and the remaining polarity select input signals corresponding to the remaining K delay circuits in the cascade ring configuration are in the first state.

8. The frequency divider circuit of claim 3, wherein the coupling circuit includes M output buffer circuits individually corresponding to one of the M delay circuits, the individual output buffer circuits including:
first and second buffer inputs respectively coupled with the first and second delay outputs of the corresponding delay circuit to receive the differential output signal from the corresponding delay circuit, and
a buffer output to provide a buffered clock output signal according to the differential output signal from the corresponding delay circuit.

9. The frequency divider circuit of claim 2, wherein the coupling circuit includes M output buffer circuits individually corresponding to one of the M delay circuits, the individual output buffer circuits including:
first and second buffer inputs respectively coupled with the first and second delay outputs of the corresponding delay circuit to receive the differential output signal from the corresponding delay circuit, and
a buffer output to provide a buffered clock output signal according to the differential output signal from the corresponding delay circuit.

10. The frequency divider circuit of claim 2, wherein the ring length logic circuit couples the differential output of the selected Nth delay circuit to the predefined first delay circuit to set a duty cycle of the first and second delay outputs of the individual delay circuits.

11. The frequency divider circuit of claim 1, wherein the coupling circuit is configurable to select the given one of the N delay circuits coupled for reverse polarity to selectively cause the delay outputs of the delay circuits to provide overlapping or non-overlapping signals.

12. The frequency divider circuit of claim 11, wherein the ring length logic circuit couples the differential output of the selected Nth delay circuit to the predefined first delay circuit to set a duty cycle of the first and second delay outputs of the individual delay circuits.

13. The frequency divider circuit of claim 1, wherein the coupling circuit includes M output buffer circuits individually corresponding to one of the M delay circuits, the individual output buffer circuits including:
first and second buffer inputs respectively coupled with the first and second delay outputs of the corresponding delay circuit to receive the differential output signal from the corresponding delay circuit, and
a buffer output to provide a buffered clock output signal according to the differential output signal from the corresponding delay circuit.

14. A frequency divider circuit, comprising:
a configurable length ring circuit including a configurable even integer number N differential delay circuits coupled in a cascade ring configuration, N being a positive even integer number greater than or equal to 4, the individual delay circuits coupled with an input clock signal with a first frequency, the delay circuits operative to provide 2N phase shifted clock signals (301-304, 401-404) at a second frequency equal to the first frequency divided by N; and
a configurable coupling circuit to reverse a polarity of a differential output signal of a selected N−K of the N delay circuits to control an amount of overlap in the phase shifted clock signals (301-304, 401-404), where 1≤K<N.

15. The frequency divider circuit of claim 14, wherein the frequency divider circuit includes M delay circuits, M being an even integer number greater than N, and wherein the coupling circuit includes a ring length logic circuit operative according to a length select input signal to couple a differential output of a selected Nth one of M delay circuits to a predefined first delay circuit of the cascade ring configuration to set a divider ratio of the frequency divider circuit according to the configured length N of the cascade ring configuration.

16. The frequency divider circuit of claim 14, wherein the coupling circuit is configurable to reverse a polarity of a differential output signal of the Nth delay circuit of the N delay circuits to provide N phase shifted clock signals at outputs of even numbered ones of the delay circuits with non-zero overlap.

17. The frequency divider circuit of claim 16, wherein the coupling circuit is configurable to reverse the polarity of the differential output signal of an (N−K)th delay circuit of the N delay circuits to provide N non-overlapping phase shifted clock signals at outputs of odd numbered ones of the delay circuits.

18. The frequency divider circuit of claim 14, wherein the coupling circuit is configurable to reverse a polarity of a differential output signal of an (N−K)th delay circuit of the N delay circuits to provide N non-overlapping phase shifted clock signals at outputs of odd numbered ones of the delay circuits.

19. The frequency divider circuit of claim 14, wherein the coupling circuit includes 2N output buffer circuits individually corresponding to a differential output signal of one of the N delay circuits, the individual output buffer circuits providing a buffered clock output signal according to the differential output signal from the corresponding delay circuit.

20. A frequency divider circuit, comprising:
an even number M differential delay circuits individually a differential delay input to receive a differential input signal, a differential delay output to provide a differential output signal, and a transistor circuit to update the differential output signal according to the differential input signal in each cycle of an input clock signal having a first frequency, M being an even integer greater than or equal to 4;
a configurable coupling circuit, including:
a logic circuit to couple the differential output of a selected Nth one of the M delay circuits to a predefined first delay circuit according to a length select input signal to set a divider ratio of the frequency divider circuit to cause the individual delay circuits to provide individual delay outputs at a second frequency equal to the first frequency divided by N, N being an even integer less than or equal to M, and
a polarity circuit to interconnect an integer number N of the delay circuits in a cascade ring configuration with N−K of the N delay circuits providing an inverted polarity output signal to a succeeding delay circuit the in the cascade ring configuration, where $1 \leq K < N$.

* * * * *